United States Patent
Liu et al.

(10) Patent No.: US 8,803,271 B2
(45) Date of Patent: Aug. 12, 2014

(54) STRUCTURES FOR GROUNDING METAL SHIELDS IN BACKSIDE ILLUMINATION IMAGE SENSOR CHIPS

(75) Inventors: Zhe-Ju Liu, Pingzhen (TW); Chih-Cherng Jeng, Madou Township (TW); Kuo-Cheng Lee, Tainan (TW); Szu-Hung Yang, Tainan (TW); Po-Zen Chen, Tainan (TW); Chi-Chin Hsu, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 39 days.

(21) Appl. No.: 13/429,114

(22) Filed: Mar. 23, 2012

(65) Prior Publication Data

US 2013/0249040 A1  Sep. 26, 2013

(51) Int. Cl.
*H01L 31/0232* (2014.01)

(52) U.S. Cl.
USPC .......... 257/435; 257/294; 257/432; 257/459; 257/E31.124

(58) Field of Classification Search
USPC .......... 257/292–294, 431–432, 435, 459.738
See application file for complete search history.

(56) References Cited

U.S. PATENT DOCUMENTS

| | | | |
|---|---|---|---|
| 7,935,994 B2 * | 5/2011 | Wang et al. | 257/292 |
| 2010/0230729 A1 * | 9/2010 | Ellis-Monaghan et al. | 257/228 |
| 2012/0242874 A1 * | 9/2012 | Noudo | 348/294 |
| 2012/0249854 A1 * | 10/2012 | Miyakawa | 348/333.01 |
| 2013/0009270 A1 * | 1/2013 | Tsai et al. | 257/459 |
| 2013/0134541 A1 * | 5/2013 | Chang et al. | 257/435 |

* cited by examiner

*Primary Examiner* — Dung A. Le

(74) *Attorney, Agent, or Firm* — Slater and Matsil, L.L.P.

(57) ABSTRACT

A device includes a semiconductor substrate having a front side and a backside. A photo-sensitive device is disposed on the front side of the semiconductor substrate. A dielectric layer is disposed on the backside of the semiconductor substrate, wherein the dielectric layer is over a back surface of the semiconductor substrate. A metal shield is over the dielectric layer and overlapping the photo-sensitive device. A metal plug penetrates through the dielectric layer, wherein the metal plug electrically couples the metal shield to the semiconductor substrate.

20 Claims, 7 Drawing Sheets

STRUCTURES FOR GROUNDING METAL SHIELDS IN BACKSIDE ILLUMINATION IMAGE SENSOR CHIPS

BACKGROUND

Backside Illumination (BSI) image sensor chips are replacing front-side illumination sensor chips for their higher efficiency in capturing photons. In the formation of the BSI image sensor chips, image sensors, such as photo diodes, and logic circuits are formed on a silicon substrate of a wafer, followed by the formation of an interconnect structure on a front side of the silicon chip.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A grounded metal shield in a Backside Illumination (BSI) image sensor chip and the methods of forming the same are provided in accordance with various exemplary embodiments. The intermediate stages of forming the grounded metal shield are illustrated. The variations of the embodiments are discussed. Throughout the various views and illustrative embodiments, like reference numbers are used to designate like elements.

Figure 1:
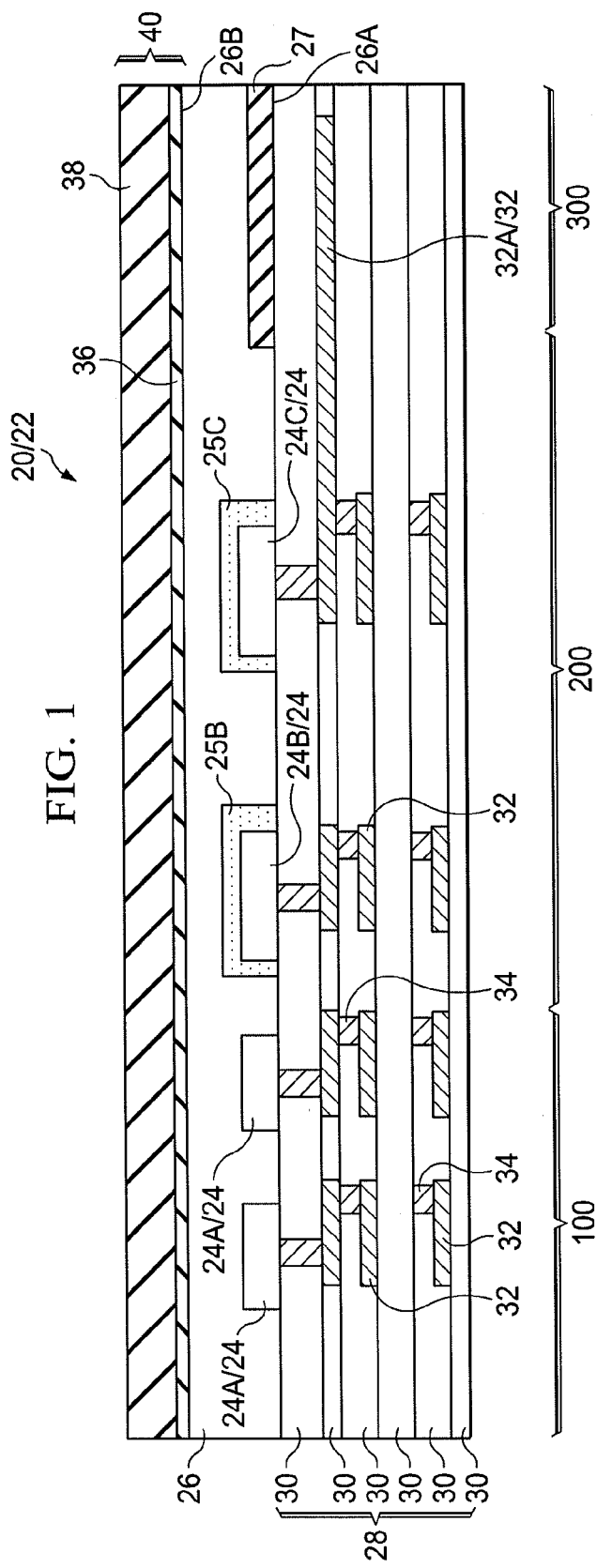
FIGS. 1 through 6 are cross-sectional views of intermediate stages in the manufacturing of a metal shield structure on a backside of a Backside Illumination (BSI) image sensor chip in accordance with exemplary embodiments.

FIGS. 1 through 6 illustrate the cross-sectional views of intermediate stages in the manufacturing of a metal shield in accordance with some exemplary embodiments. FIG. 1 illustrates image sensor chip 20, which may be a part of an un-sawed wafer 22. Image sensor chip 20 includes semiconductor substrate 26. Semiconductor substrate 26 may be a crystalline silicon substrate or a semiconductor substrate formed of other semiconductor materials. In some embodiments, semiconductor substrate 26 is lightly doped with a p-type impurity. Throughout the description, surface 26A is referred to a front surface of semiconductor substrate 26, and surface 26B is referred to as a back surface of semiconductor substrate 26. Image sensors 24 (including 24A and 24B) are formed at surface 26A of semiconductor substrate 26. Image sensors 24 are configured to convert light signals (photons) to electrical signals, and may be photo-sensitive Metal-Oxide-Semiconductor (MOS) transistors or photo-sensitive diodes. Accordingly, the respective wafer 22 may be an image sensor wafer. In some exemplary embodiments, image sensors 24 extend from front surface 26A into semiconductor substrate 26. The structures of image sensors 24A and 24B may be identical to each other.

Front-side interconnect structure 28 is formed over semiconductor substrate 26, and is used to electrically interconnect the devices in image sensor chip 20. Front-side interconnect structure 28 includes dielectric layers 30, and metal lines 32 and vias 34 in dielectric layers 30. Throughout the description, all of the metal lines 32 in a same dielectric layer 30 are collectively referred to as being a metal layer. Front-side interconnect structure 28 may include a plurality of metal layers. In some exemplary embodiments, dielectric layers 30 include low-k dielectric layers and passivation layers. The low-k dielectric layers have low k values, for example, lower than about 3.0. The passivation layers may be formed of non-low-k dielectric materials having k values greater than 3.9. In some embodiments, the passivation layers include a silicon oxide layer and a silicon nitride layer on the silicon oxide layer.

Image sensor chip 20 includes active image sensor pixel region 100, shielded region 200, and region 300. Active image sensor pixel region 100 includes active image sensors 24A formed therein, which are used for generating electrical signals from the sensed light. Image sensors 24A may form an active image sensor pixel array, which includes a plurality of image sensors arranged as rows and columns. Shielded region 200 includes black reference image sensors, which are illustrated as 24B, formed therein. The black reference image sensors are used for generating reference black level signals, which are used to calibrate the electrical signals generated by active image sensors 24A. Furthermore, shielded region 200 may include logic devices 24C, which may include Complementary MOS (CMOS) transistors. Logic devices 24C may be used, for example, to process the electrical signals generated by the image sensors. In some embodiments, black reference image sensors 24B and logic devices 24C are formed in, or alternatively include, p-well regions 25B and 25C, respectively, which may have a p-type impurity concentration higher than the p-type impurity concentration of substrate 26. The p-type impurity concentration in p-well regions 25B and 25C may be between about $1E12/cm^3$ and about $1E14/cm^3$, for example.

Region 300 may include a bond region, in which bond pads can be formed. Electrical bonds may be formed to connect to the bond pads that are formed on the backside of image sensor chip 20 (refer to FIG. 6). Region 300 may further include test regions for forming test structures that are used for testing the performance of image sensor chip 20.

A backside grinding is performed to thin semiconductor substrate 26, and the thickness of wafer 22 is reduced to smaller than about 30 μm, or smaller than about 5 μm, for example. With semiconductor substrate 26 having a small thickness, light can penetrate from back surface 26B into semiconductor substrate 26, and reach image sensors 24A.

After the step of thinning, buffer layers 40 (also referred to as dielectric layers throughout the description) are formed on the surface of semiconductor substrate 26. In some exemplary embodiments, buffer layers 40 include Bottom Anti-Reflective Coating (BARC) 36, and silicon oxide layer 38 over BARC layer 36. It is appreciated that buffer layers 40 may have different structures, formed of different materials, and may have different number of layers other than illustrated. In some embodiments, silicon oxide layer 38 may be formed using Plasma Enhanced Chemical Vapor Deposition (PECVD), and hence is referred to as Plasma Enhanced (PE) oxide layer 38.

Figure 2:
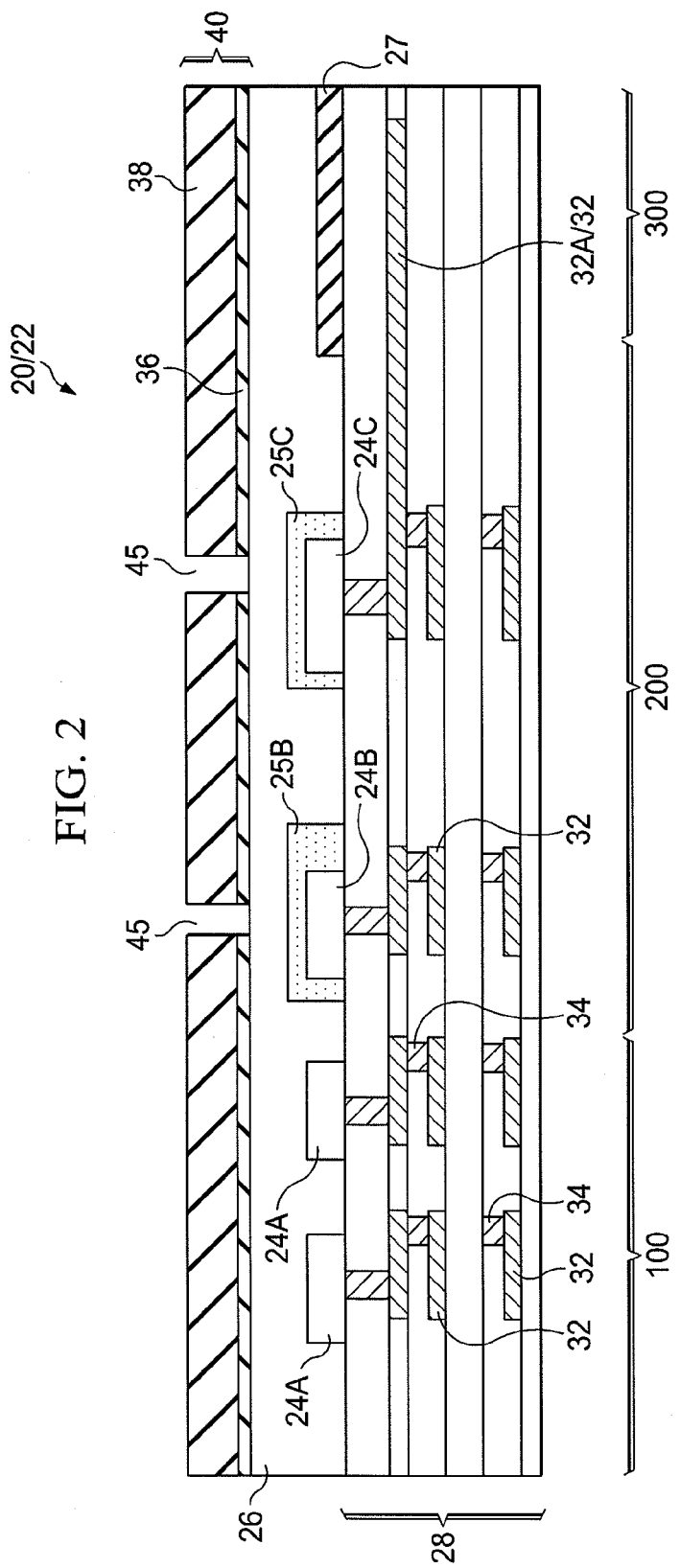

Referring to FIG. 2, buffer layers 40 are patterned to form openings 45 in an etching step, wherein semiconductor substrate 26 is exposed through openings 45. There may be a single opening 45 formed in chip 20 in accordance with some embodiments. Alternatively, the total count of openings 45 may range from two to any integer number that is greater than two. In some embodiments, openings 45 overlap p-well region 25C of logic devices 24C, while no opening is formed overlapping p-well region 25B of black reference image sensor 24B. In alternative embodiments, openings 45 overlap both p-well region 25B of black reference image sensor 24B and p-well region 25C of logic devices 24C. In yet other embodiments, openings 45 overlap p-well region 25B of black reference image sensors 24B, while no opening is formed overlapping p-well region 25C of logic devices 24C. Openings 45 may also be adjacent to, and not overlapping, p-well regions 25B and/or 25C.

Figure 3:
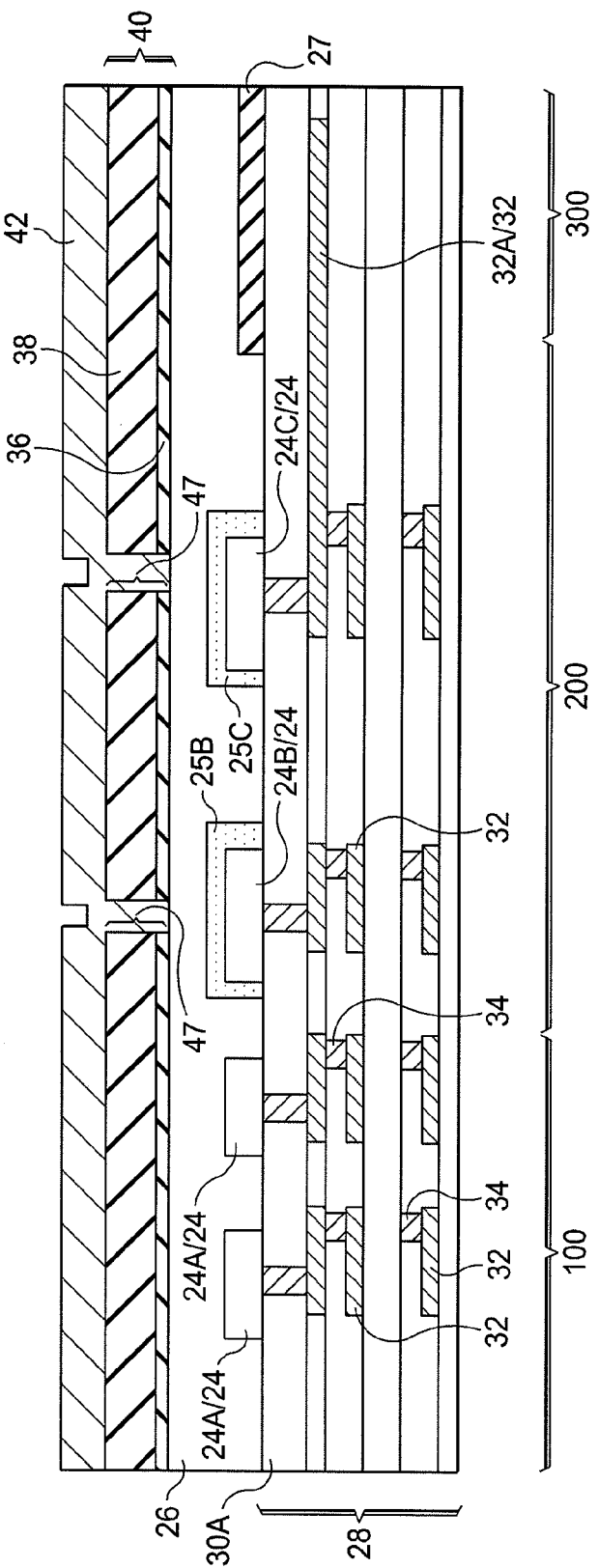
Figure 4:
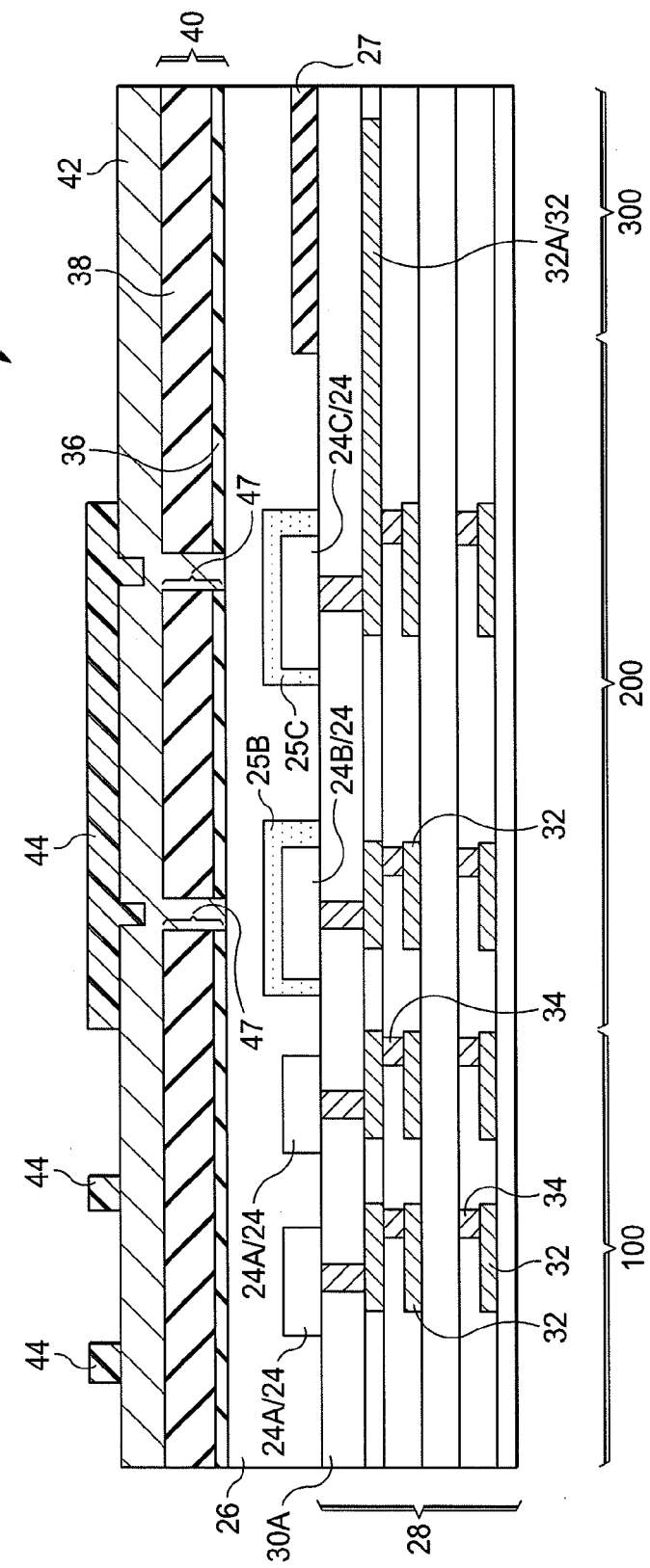

Referring to FIG. 3, metal layer 42 is formed over buffer layers 40. In some embodiments, the metals in metal layer 42 include tungsten, aluminum, copper, and/or the like. For example, metal layer 42 may be formed of aluminum copper. The thickness of metal layer 42 may be greater than about 2000 Å, for example. It is appreciated that the dimensions recited throughout the description are merely examples, and may be changed to different values. The portion of metal layer 42 in openings 45 (FIG. 3) form metal plugs 47, which electrically connect metal shield 48 to semiconductor substrate 26. Next, as shown in FIG. 4, photo resist 44 is formed over metal layer 42, and is then patterned.

Figure 5:
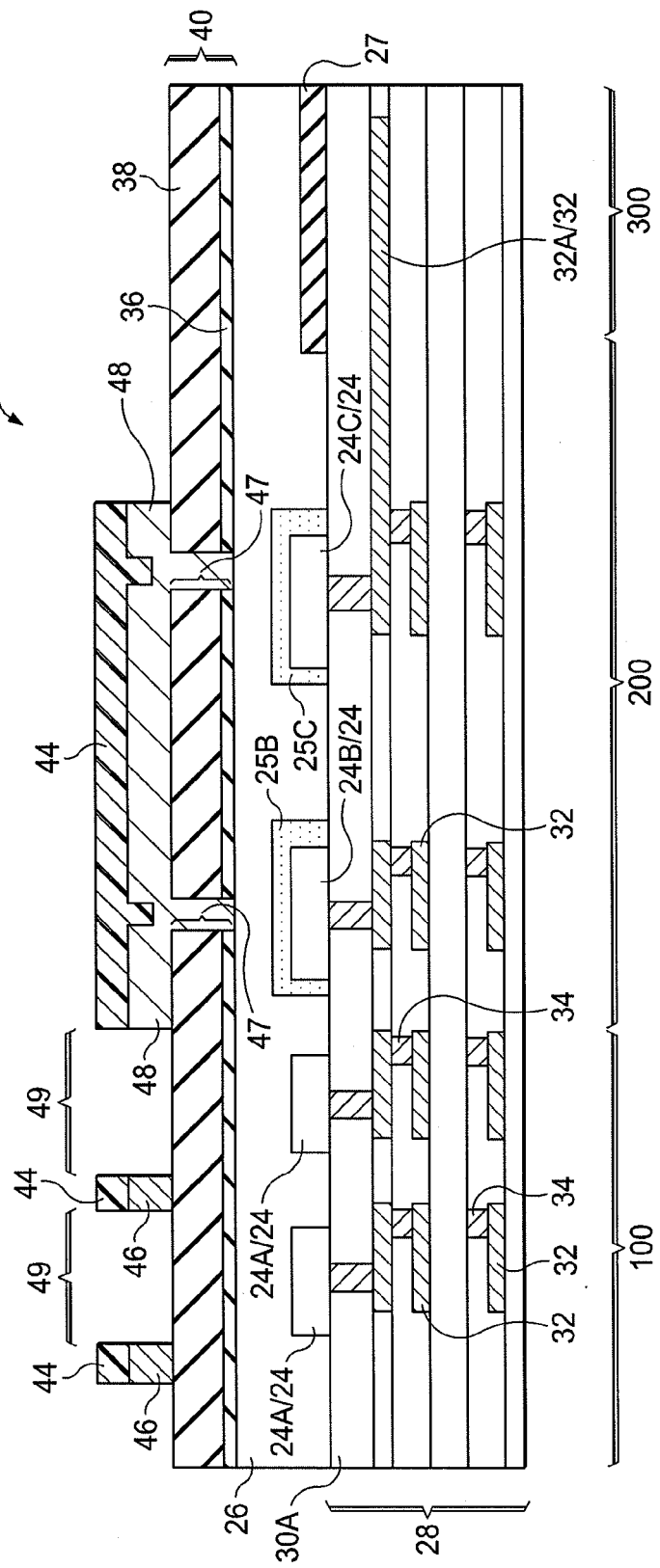

Referring to FIG. 5, the patterned photo resist 44 is used as an etching mask to etch through metal layer 42. The remaining portions of metal layer 42 forms a metal grid in active image sensor pixel region 100 and metal shield 48 in shielded region 200. Metal layer 42 may be removed from at least part of region 300. The metal grid includes metal grid lines 46. Grid openings 49 are formed between grid lines 46. Each of grid openings 49 may be over and aligned to one of active image sensors 24A.

Metal shield 48 is over and aligned to black reference image sensors 24B and logic devices 24C. Metal shield 48 is sometimes referred to as an optical shield, which is used to prevent light from being received by black reference image sensors 24B and logic devices 24C. Between p-well regions 25B/25C and metal plugs 47, there is a portion of semiconductor substrate, which may also be of p-type. This portion of the semiconductor substrate may be in contact with both p-well regions 25B/25C and metal plugs 47.

In the etching of metal shield 48 and further during the operation of image sensor chip 20, charges (such as electrons) may be accumulated in metal shield 48 if metal plugs 47 are not formed. The accumulated charges may adversely affect the performance of image sensor chip 20. For example, with the accumulated charges, the resulting image that is captured by image sensor chip 20 may be too bright, and the bright level of the pixels may easily saturate when image sensor chip 20 is exposed to bright environments. By connecting metal shield 48 to semiconductor substrate 26 through metal plugs 47, metal shield 48 is grounded, and the accumulated charges, if any, may be conducted to semiconductor substrate 26, p-well regions 25B, and/or p-well regions 25C. The adverse effect of the accumulated charges is thus eliminated.

Figure 6:
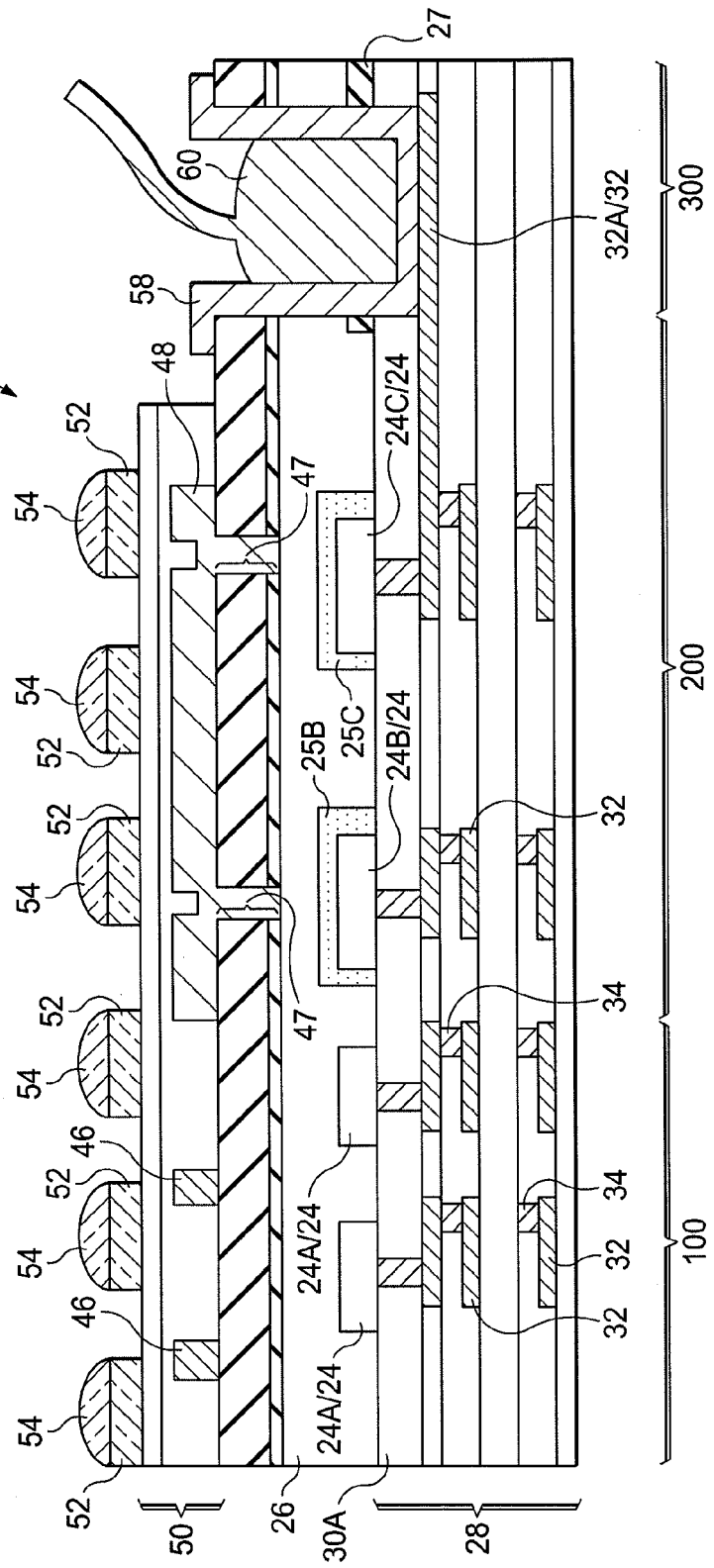

In a subsequent step, photo resist 44 is removed. Next, as shown in FIG. 6, dielectric layers 50 are formed. Dielectric layers 50 may include an oxide layer, which may be a silicon oxide layer formed using PECVD, for example. Dielectric layers 50 may further include a silicon nitride layer over the oxide layer. In some embodiments, a planarization step such as a Chemical Mechanical Polish (CMP) is performed to level the top surface of oxide layers 50. In subsequent process steps, additional components such as color filters 52 and micro-lenses 54 are formed, with each of active image sensors 24A aligned to one of color filters 52 and one of micro-lenses 54. In region 300, a trench may be formed to penetrate through buffer layers 40, semiconductor substrate 26, Shallow Trench Isolation (STI) region 27, and Inter-Layer Dielectric (ILD) 30A. Bond pad 58 is then formed in the trench. In the resulting structure, bond pad 58 is electrically coupled to metal pad 32A, which is further coupled electrically to other devices such as image sensors 24A and 24B and/or logic devices 24C. In some embodiments, a wire bonding is performed to form wire bond bump 60 that is bonded to bond pad 58. The wire bonding may be performed after wafer 22 is sawed apart into image sensor chips.

Figure 7A:
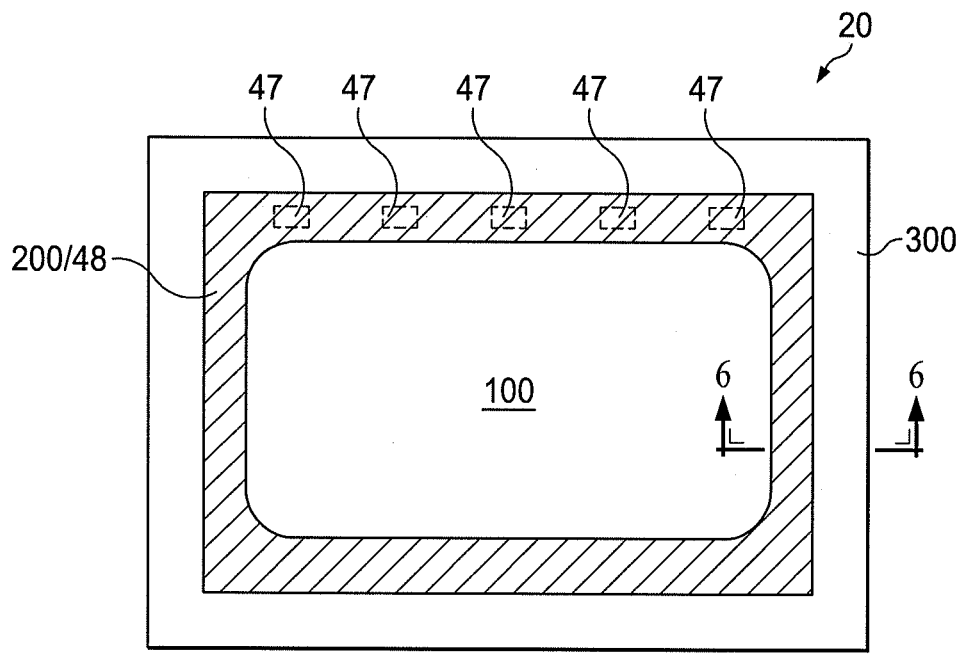
FIGS. 7A and 7B illustrate top views of an image sensor chip comprising the metal shield structure.
Figure 7B:
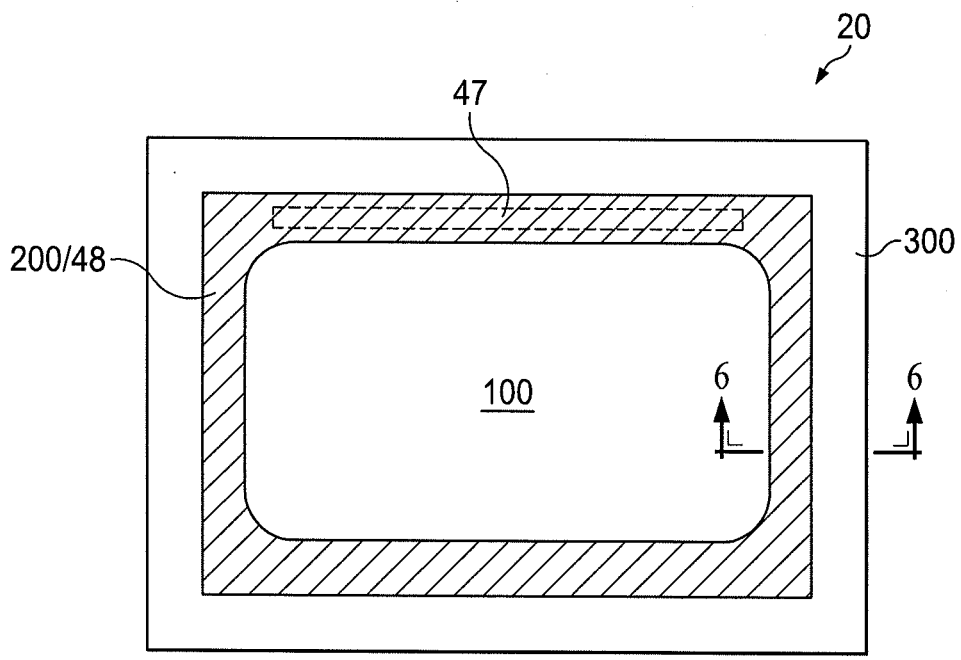

FIGS. 7A and 7B illustrate exemplary top views of regions 100, 200, and 300. The cross-sectional view in FIG. 6 may be obtained from the plane crossing lines 6-6 in FIGS. 7A and 7B. In accordance with some embodiments, metal shield 48 forms a full ring that encircles region 100 and grid lines 46 (not shown, please refer to FIG. 6). Metal plugs 47 are illustrated using dashed lines to indicate that metal plugs 47 are under metal shield 48. In some embodiments, as shown in FIG. 7A, a plurality of metal plugs 47 are formed. Although FIG. 7A shows that metal plugs 47 are distributed along one side of the metal shield ring 48, metal plugs 47 may be distributed to other sides. Metal plugs 47 may have square or round top views. In alternative embodiments, as shown in FIG. 7B, there may be a single metal plug 47, which may have an elongated shape or any other shape.

In the embodiments, metal plugs 47 are formed to connect metal shield 48 to semiconductor substrate 26. As a result, the accumulated charges in metal shield 48 are conducted to semiconductor substrate 26 and/or p-well regions 25. The adverse effect of the accumulated charges is thus eliminated.

In accordance with embodiments, a device includes a semiconductor substrate having a front side and a backside. A photo-sensitive device is disposed on the front side of the semiconductor substrate. A dielectric layer is disposed on the backside of the semiconductor substrate, wherein the dielectric layer is over a back surface of the semiconductor substrate. A metal shield is over the dielectric layer and overlapping the photo-sensitive device. A metal plug penetrates through the dielectric layer, wherein the metal plug electrically couples the metal shield to the semiconductor substrate.

In accordance with other embodiments, a device includes a semiconductor substrate having a front side and a backside. A first photo-sensitive device, a second photo-sensitive device, and a logic device are disposed on the front side of the semiconductor substrate. A dielectric layer is on the backside of the semiconductor substrate, wherein the dielectric layer is over a back surface of the semiconductor substrate, and extends over the first and the second photo-sensitive devices and the logic device. A metal shield is over the dielectric layer and overlapping the first photo-sensitive device and the logic device. A metal plug penetrates through the dielectric layer, wherein the metal plug is in contact with the metal shield and the semiconductor substrate.

In accordance with yet other embodiments, a method includes forming a plurality of photo-sensitive devices on a front side of a semiconductor substrate, and forming a dielectric layer on a backside of the semiconductor substrate. The dielectric layer is over the semiconductor substrate. An opening is formed in the dielectric layer to expose a back surface of the semiconductor substrate. A metal layer is formed over the dielectric layer, wherein a first portion of the metal layer fills the opening to form a metal plug. The metal layer is patterned, wherein second portions of the metal layer overlapping the plurality of photo-sensitive devices is removed, and a third portion of the metal layer overlapping the metal plug is not removed.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a semiconductor substrate having a front side and a backside;
    a photo-sensitive device disposed on the front side of the semiconductor substrate;
    a dielectric layer on the backside of the semiconductor substrate, wherein the dielectric layer is over a back surface of the semiconductor substrate;
    a metal shield over the dielectric layer and overlapping the photo-sensitive device; and
    a metal plug penetrating through the dielectric layer, wherein the metal plug electrically couples the metal shield to the semiconductor substrate.

2. The device of claim 1, wherein the metal plug is formed of a same material as the metal shield.

3. The device of claim 1 further comprising a p-well region in the semiconductor substrate, wherein the metal plug overlaps the p-well region.

4. The device of claim 3 further comprising a transistor disposed in the p-well region.

5. The device of claim 3, wherein a portion of the semiconductor substrate that is of p-type is in contact with the metal plug and the p-well region.

6. The device of claim 1 further comprising a plurality of dielectric layers disposed between the metal shield and the semiconductor substrate, wherein the metal plug penetrates through the plurality of dielectric layers, and wherein the dielectric layer is one of the plurality of dielectric layers.

7. The device of claim 1 further comprising:
    a grid comprising a plurality of grid lines on the backside of the semiconductor substrate, wherein the plurality of grid lines and the metal shield are substantially level with each other, and are formed of a same material; and
    a plurality of photo-sensitive devices underlying and aligned to grid openings between the plurality of grid lines, wherein the plurality of photo-sensitive devices is at the front side of the semiconductor substrate, and is configured to receive light from the backside of the semiconductor substrate and convert the light to electrical signals.

8. A device comprising:
    a semiconductor substrate having a front side and a backside;
    a first photo-sensitive device, a second photo-sensitive device, and a logic device disposed on the front side of the semiconductor substrate;
    a dielectric layer on the backside of the semiconductor substrate, wherein the dielectric layer is over a back surface of the semiconductor substrate, and extends over the first and the second photo-sensitive devices and the logic device;
    a metal shield over the dielectric layer and overlapping the first photo-sensitive device and the logic device; and
    a metal plug penetrating through the dielectric layer, wherein the metal plug is in contact with the metal shield and the semiconductor substrate.

9. The device of claim 8, wherein the metal plug is formed of a same material as the metal shield.

10. The device of claim 8 further comprising a plurality of metal plugs penetrating through the dielectric layer, wherein the plurality of metal plugs electrically couples the metal shield to the semiconductor substrate.

11. The device of claim 8 further comprising a p-well region in the semiconductor substrate, wherein the metal plug overlaps the p-well region, and wherein the logic device is disposed in the p-well region.

12. The device of claim 8 further comprising a pixel array, wherein the pixel array comprises the second photo-sensitive device, and wherein the metal shield does not extend over the pixel array.

13. The device of claim 8 further comprising:
    a grid comprising a plurality of grid lines on the backside of the semiconductor substrate, wherein the plurality of grid lines and the metal shield are substantially level with each other, and are formed of a same material; and
    a plurality of photo-sensitive devices underlying and aligned to grid openings between the plurality of grid lines, wherein the plurality of photo-sensitive devices is at the front side of the semiconductor substrate, and is configured to receive light from the backside of the semiconductor substrate and convert the light to electrical signals.

14. The device of claim 13, wherein the metal shield forms a ring encircling the grid.

15. A device comprising:
    a semiconductor substrate having a front side and a backside;
    a photo-sensitive device and a logic device disposed at the front side of the semiconductor substrate;
    a dielectric layer on the backside of the semiconductor substrate, wherein the dielectric layer is overlying a back surface of the semiconductor substrate; and
    a metal feature comprising:
        a metal shield over the dielectric layer and overlapping the photo-sensitive device; and
        a metal plug extends from the metal shield down into the dielectric layer, wherein a bottom surface of the metal plug is in contact with the semiconductor substrate, wherein the metal plug and the metal shield form a continuous region, and wherein the metal plug and the metal shield are formed of a same material.

16. The device of claim 15 further comprising a p-well region in the semiconductor substrate, wherein the metal plug overlaps the p-well region, and wherein the logic device is disposed in the p-well region.

17. The device of claim 15, wherein the metal plug is in contact with a p-type region of the semiconductor substrate.

18. The device of claim 15 further comprising;
a pixel array comprising a plurality of photo-sensitive devices forming an array; and
a metal grid over and contacting the dielectric layer, wherein grid openings of the metal grid overlap the plurality of photo-sensitive devices.

19. The device of claim 18, wherein the metal grid and the metal shield are formed of a same material.

20. The device of claim 15, wherein the dielectric layer comprises an oxide.

\* \* \* \* \*